(12) United States Patent
Tanaka et al.

(10) Patent No.: US 11,410,834 B2
(45) Date of Patent: Aug. 9, 2022

(54) SUBSTRATE PROCESSING METHOD

(71) Applicant: Tokyo Electron Limited, Tokyo (JP)

(72) Inventors: Keiichi Tanaka, Nirasaki (JP); Tatsuo Matsudo, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/253,789

(22) PCT Filed: Jun. 13, 2019

(86) PCT No.: PCT/JP2019/023407
§ 371 (c)(1),
(2) Date: Dec. 18, 2020

(87) PCT Pub. No.: WO2020/004048
PCT Pub. Date: Jan. 2, 2020

(65) Prior Publication Data
US 2021/0280394 A1 Sep. 9, 2021

(30) Foreign Application Priority Data
Jun. 27, 2018 (JP) .............................. JP2018-122164

(51) Int. Cl.
*H01L 21/306* (2006.01)
*H01J 37/32* (2006.01)
*C23C 14/06* (2006.01)
*C23C 14/10* (2006.01)
*C23C 14/22* (2006.01)
(Continued)

(52) U.S. Cl.
CPC .... *H01J 37/32568* (2013.01); *C23C 14/0652* (2013.01); *C23C 14/10* (2013.01); *C23C 14/221* (2013.01); *H01L 21/022* (2013.01); *H01L 21/02274* (2013.01); *H01L 21/28568* (2013.01); *H01J 37/32091* (2013.01); *H01J 2237/332* (2013.01); *H01L 21/0217* (2013.01); *H01L 21/02164* (2013.01)

(58) Field of Classification Search
CPC ..................................................... H01L 21/306
See application file for complete search history.

(56) References Cited

U.S. PATENT DOCUMENTS

2016/0064194 A1\* 3/2016 Tokashiki ......... H01J 37/32091
156/345.28
2017/0062190 A1\* 3/2017 Lee .................... H01J 37/32027

FOREIGN PATENT DOCUMENTS

JP        11-31685 A      2/1999
JP     2005-26063 A      1/2005
(Continued)

*Primary Examiner* — Thomas T Pham
(74) *Attorney, Agent, or Firm* — Nath, Goldberg & Meyer; Jerald L. Meyer

(57) ABSTRACT

A substrate processing apparatus of the present disclosure includes a processing container capable of being vacuum-exhausted, a lower electrode, and an upper electrode. A target substrate can be placed on the lower electrode. The upper electrode is disposed in the processing container so as to face the lower electrode. A substrate processing method of the present disclosure includes performing a first process on the target substrate using an AC voltage without using a DC pulse voltage, and performing a second process on the target substrate using the DC pulse voltage.

2 Claims, 11 Drawing Sheets

(51) Int. Cl.
*H01L 21/02* (2006.01)
*H01L 21/285* (2006.01)

(56) References Cited

FOREIGN PATENT DOCUMENTS

| | | | |
|---|---|---|---|
| JP | 2009-239012 | A | 10/2009 |
| JP | 2011-119720 | A | 6/2011 |

* cited by examiner

SUBSTRATE PROCESSING METHOD

TECHNICAL FIELD

The present disclosure relates to a substrate processing method.

BACKGROUND

In a process of manufacturing a semiconductor device, a semiconductor wafer may be subjected to an ion bombardment process before the semiconductor wafer is subjected to a film forming process. In the ion bombardment process, for example, $Ar^+$ ionized by high frequency plasma is struck against the surface of the semiconductor wafer so that a natural oxide film adhering to the surface of the semiconductor wafer is destroyed and washed out.

PRIOR ART DOCUMENTS

Patent Document

Japanese laid-open publication No. 2009-239012

In order to perform the ion bombardment process before the film forming process, it was necessary to prepare two chambers: a chamber for the ion bombardment process (hereinafter sometimes referred to as an "ion bombardment chamber") and a chamber for the film forming process (hereinafter sometimes referred to as a "film forming chamber").

Further, when the semiconductor wafer after the ion bombardment process is transferred from the ion bombardment chamber to the film forming chamber in the air, the natural oxide film removed by the ion bombardment adheres to the semiconductor wafer again in the air. Therefore, it is necessary to transfer the semiconductor wafer from the ion bombardment chamber to the film forming chamber by vacuum transfer.

When the two chambers for different purposes are prepared, the manufacturing cost of semiconductor devices increases. Further, since a separate device for vacuum transfer is required for vacuum transfer of the semiconductor wafer, the vacuum transfer of the semiconductor wafer further increases the manufacturing cost of the semiconductor devices.

The present disclosure provides some embodiments of a technique capable of suppressing the manufacturing cost of semiconductor devices.

SUMMARY

A substrate processing apparatus of the present disclosure includes a processing container capable of being vacuum-exhausted, a lower electrode, and an upper electrode. A target substrate can be placed on the lower electrode. The upper electrode is disposed in the processing container so as to face the lower electrode. A substrate processing method of the present disclosure includes performing a first process on the target substrate using an AC voltage without using a DC pulse voltage, and performing a second process on the target substrate using the DC pulse voltage.

According to the technique of the present disclosure, it is possible to suppress the manufacturing cost of semiconductor devices.

DETAILED DESCRIPTION

Figure 1:
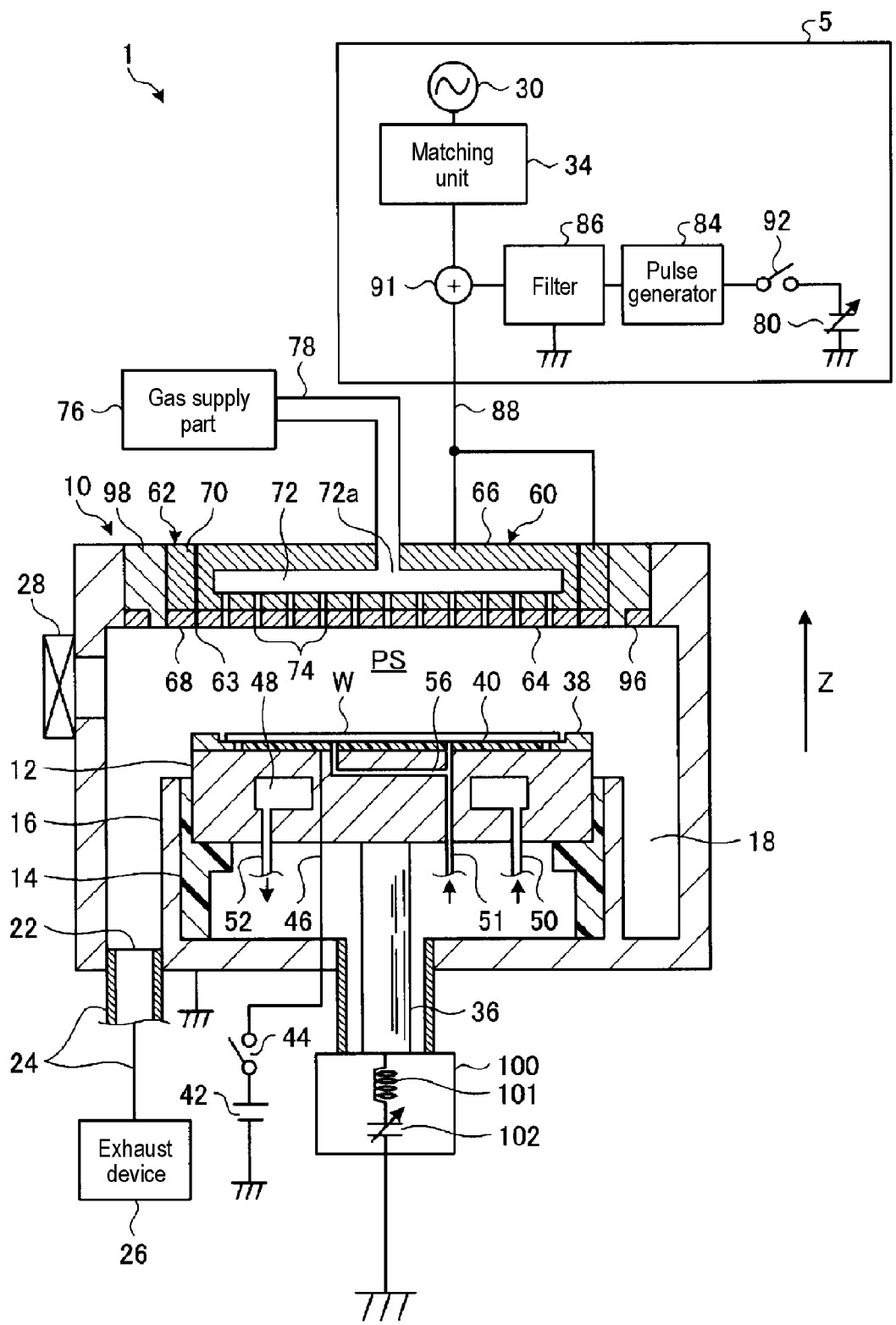
FIG. 1 is a view illustrating a configuration example of a substrate processing apparatus according to a first embodiment.

Embodiments of the technique of the present disclosure will now be in detail described with reference to the drawings. The same configurations in the embodiments are denoted by the same reference numerals, and therefore, explanation thereof will not be repeated.

First Embodiment

<Configuration of Substrate Processing Apparatus>

FIG. 1 is a view illustrating a configuration example of a substrate processing apparatus according to a first embodiment. The substrate processing apparatus 1 illustrated in FIG. 1 is configured as a capacitively-coupled parallel plate substrate processing apparatus.

In FIG. 1, the substrate processing apparatus 1 has a chamber 10 which is a metal-made processing container made of, for example, aluminum or stainless steel. The chamber 10 is grounded for security.

A disc-shaped susceptor 12 is horizontally disposed in the chamber 10. A semiconductor wafer W as a target substrate for substrate processing can be placed on the susceptor 12. The susceptor 12 also functions as a lower electrode. A gate valve 28 for opening and closing a loading/unloading port of the semiconductor wafer W is provided to a sidewall of the chamber 10. The susceptor 12 is made of, for example, MN ceramic or the like, and is supported by an insulating cylindrical support part 14 extending vertically upward from the bottom of the chamber 10.

An annular exhaust path 18 is formed between a conductive cylindrical support part (inner wall portion) 16, which extends vertically upward from the bottom of the chamber 10 along the outer circumference of the cylindrical support part 14, and the sidewall of the chamber 10. An exhaust port 22 is installed at the bottom of the exhaust path 18.

An exhaust device 26 is connected to the exhaust port 22 via an exhaust pipe 24. The exhaust device 26 has a vacuum pump such as a turbo molecular pump or the like, and decompresses a processing space in the chamber 10 to a desired degree of vacuum. It is preferable that the interior of the chamber 10 is maintained at a constant pressure in a range of, for example, 200 mTorr to 2,500 mTorr.

An impedance adjustment circuit 100 having a coil 101 and a variable capacitor 102 is electrically connected between the susceptor 12 serving as the lower electrode and the ground via a connecting rod 36.

The semiconductor wafer W to be processed on a substrate is placed on the susceptor 12, and a ring 38 is installed so as to surround the semiconductor wafer W. The ring 38 is made of a conductive material (for example, Ni, Al, etc.) and is detachably provided to the upper surface of the susceptor 12.

Further, an electrostatic chuck 40 for wafer attraction is installed on the upper surface of the susceptor 12. The electrostatic chuck 40 is formed by sandwiching a sheet-shaped or mesh-shaped conductor between film-shaped or plate-shaped dielectrics. A DC power supply 42 disposed outside the chamber 10 is electrically connected to a conductor inside the electrostatic chuck 40 via an on/off changeover switch 44 and a power feeding line 46. The semiconductor wafer W is attracted and held on the electrostatic chuck 40 by a Coulomb force generated in the electrostatic chuck 40 by the DC voltage applied from the DC power supply 42.

An annular refrigerant chamber 48 extending in the circumferential direction is installed inside the susceptor 12. A refrigerant (for example, cooling water) having a predetermined temperature is circulated and supplied to the refrigerant chamber 48 from a chiller unit (not shown) via pipes 50 and 52. By controlling the temperature of the refrigerant, the temperature of the semiconductor wafer W on the electrostatic chuck 40 is controlled. Further, in order to improve the temperature accuracy of the semiconductor wafer W, a heat transfer gas (for example, He gas) from a heat transfer gas supply part (not shown) is supplied between the electrostatic chuck 40 and the semiconductor wafer W through a gas supply pipe 51 and a gas passage 56 in the susceptor 12.

A disc-shaped inner upper electrode 60 and a ring-shaped outer upper electrode 62 are concentrically installed on the ceiling of the chamber 10 so as to face to face (that is, oppose to each other) parallel to the susceptor 12. As a suitable size in the radial direction, the inner upper electrode 60 has the same diameter as the semiconductor wafer W, and the outer upper electrode 62 has the same diameter (inner diameter/outer diameter) as the ring 38. However, the inner upper electrode 60 and the outer upper electrode 62 are electrically insulated from each other. A ring-shaped insulator 63 made of, for example, ceramic is interposed between the electrodes 60 and 62.

The inner upper electrode 60 has an electrode plate 64 facing directly in front of the susceptor 12, and an electrode support 66 that detachably supports the electrode plate 64 from behind (above). The electrode plate 64 may be made of, for example, a conductive material such as Ni or Al. The electrode support 66 is made of, for example, alumite-treated aluminum. The outer upper electrode 62 also has an electrode plate 68 facing the susceptor 12, and an electrode support 70 that detachably supports the electrode plate 68 from behind (above). The electrode plate 68 and the electrode support 70 may be made of the same material as the electrode plate 64 and the electrode support 66, respectively. Hereinafter, the inner upper electrode 60 and the outer upper electrode 62 may be collectively referred to as "upper electrodes 60 and 62". In this way, in the substrate processing apparatus 1, the disc-shaped susceptor 12 (that is, the lower electrode) and the disc-shaped upper electrodes 60 and 62 face each other in parallel.

In the present embodiment, the case where the upper electrodes 60 and 62 are composed of two members, i.e., the inner upper electrode 60 and the outer upper electrode 62, is given as an example. However, the upper electrodes may be composed of one member.

The inner upper electrode 60 is also used as a shower head in order to supply a process gas into a processing space PS set between the upper electrodes 60 and 62 and the susceptor 12. More specifically, a gas diffusion chamber 72 is provided inside the electrode support 66, and a large number of gas discharge holes 74 penetrating from the gas diffusion chamber 72 to the susceptor 12 side are formed in the electrode support 66 and the electrode plate 64. A gas supply pipe 78 extending from a gas supply part 76 is connected to a gas introduction port 72a installed in the upper portion of the gas diffusion chamber 72. A shower head may be installed not only on the inner upper electrode 60 but also on the outer upper electrode 62.

A voltage applying part 5 for outputting an applied voltage is disposed outside the chamber 10. The voltage applying part 5 is connected to the upper electrodes 60 and 62 via a power feeding line 88. The voltage applying part 5 includes a high frequency power supply 30, a matching unit 34, a variable DC power supply 80, an on/off changeover switch 92, a pulse generator 84, a filter 86, and a superimposing device 91.

The high frequency power supply 30 generates a high frequency AC voltage (hereinafter sometimes referred to as a "high frequency voltage") and supplies the generated high frequency voltage to the superimposing device 91 via the matching unit 34. The frequency of the high frequency voltage generated by the high frequency power supply 30 is, for example, preferably 13 MHz or more.

Figure 2:
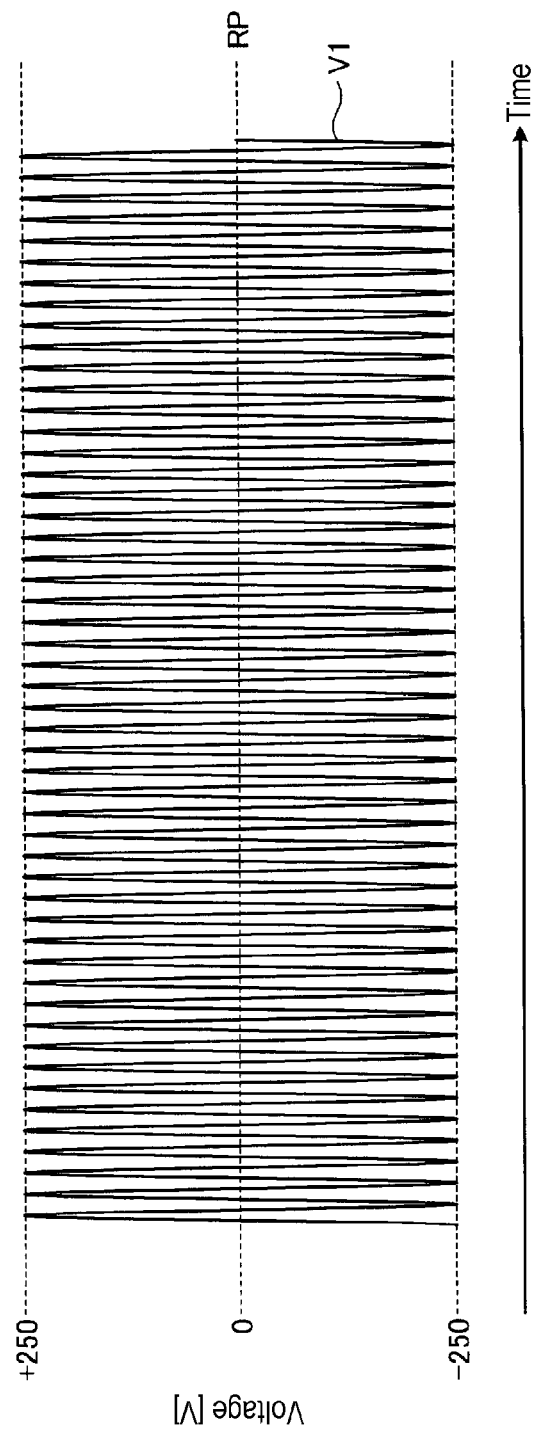
FIG. 2 is a view illustrating an example of a high frequency voltage according to the first embodiment.

FIG. 2 is a view illustrating an example of the high frequency voltage according to the first embodiment. As illustrated in FIG. 2, the high frequency power supply 30 generates, for example, a high frequency voltage V1 of −250V to 250V with 0V as a reference potential RP. The matching unit 34 matches the impedance on the high frequency power supply 30 side with the impedance on a load (mainly electrodes, plasma, chamber, etc.) side.

An output terminal of the variable DC power supply 80 is connected to the pulse generator 84 via the on/off changeover switch 92, and the variable DC power supply 80 outputs a negative DC voltage to the pulse generator 84. When the on/off changeover switch 92 is on, a negative DC voltage is input to the pulse generator 84, while when the on/off changeover switch 92 is off, a negative DC voltage is not input to the pulse generator 84. The pulse generator 84 uses the negative DC voltage input from the variable DC power supply 80 to generate a rectangular wave DC pulse voltage, and supplies the generated DC pulse voltage to the superimposing device 91 through the filter 86. The frequency of the DC pulse voltage generated by the pulse generator 84 is, for example, preferably 10 kHz to 1 MHz. Further, the duty ratio of the DC pulse voltage generated by the pulse generator 84 is preferably 10% to 90%.

Figure 3:
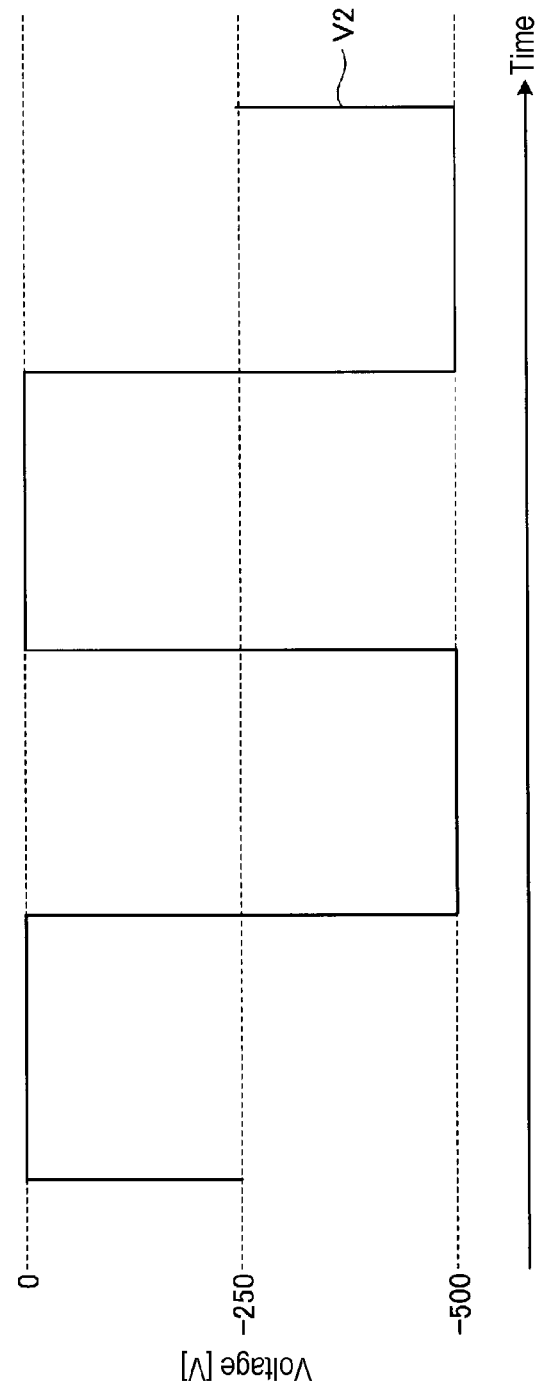
FIG. 3 is a view illustrating an example of a DC pulse voltage according to the first embodiment.

FIG. 3 is a view illustrating an example of the DC pulse voltage according to the first embodiment. As illustrated in FIG. 3, the pulse generator 84 generates, for example, a rectangular wave DC pulse voltage V2 of 0V to −500V.

The filter 86 outputs the DC pulse voltage, which is output from the pulse generator 84, to the superimposing device 91 therethrough, while flowing the high frequency voltage, which is output from the high frequency power supply 30, to the ground line and not flowing it to the pulse generator 84 side.

The superimposing device 91 superimposes the high frequency voltage output from the high frequency power supply 30 and the DC pulse voltage output from the pulse generator 84 so that a voltage obtained by the superimposition (hereinafter sometimes referred to as a "superimposed voltage") is generated. The generated superimposed voltage is applied to the upper electrodes 60 and 62 via the power feeding line 88.

Figure 4:
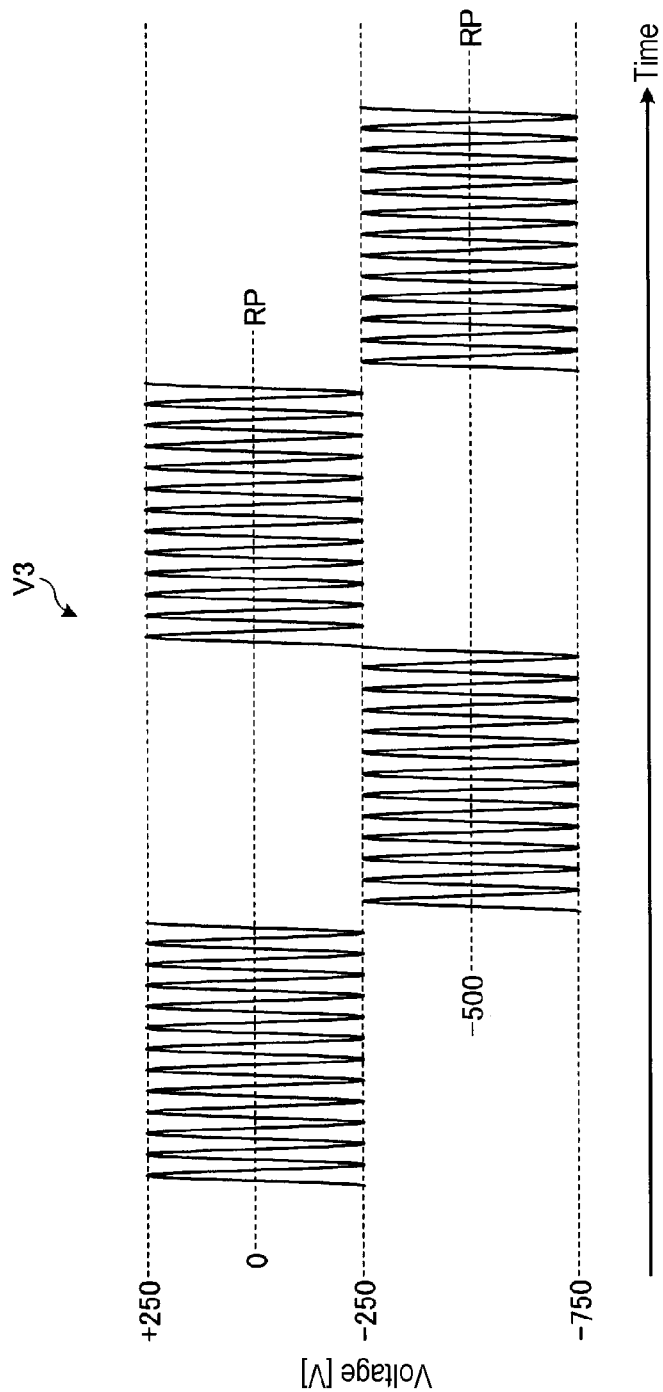
FIG. 4 is a view illustrating an example of a superimposed voltage according to the first embodiment.

FIG. 4 is a view illustrating an example of the superimposed voltage according to the first embodiment. When the high frequency voltage V1 shown in FIG. 2 and the DC pulse voltage V2 shown in FIG. 3 are superimposed, a superimposed voltage V3 shown in FIG. 4 is generated. By superimposing the DC pulse voltage on the high frequency voltage, as illustrated in FIG. 4, in the superimposed voltage V3, a reference potential RP of the high frequency voltage V1 (FIG. 2) changes periodically alternately up and down with the passage of time in accordance with the waveform of the rectangular wave DC pulse voltage V2 (FIG. 3). That is, when the on/off changeover switch 92 is on, the voltage applying part 5 outputs a high frequency voltage that changes in a pulse shape (that is, a rectangular wave shape).

In this way, when the on/off changeover switch 92 is on, since the negative DC voltage output from the variable DC power supply 80 is supplied to the pulse generator 84, the superimposed voltage is output from the superimposing device 91. On the other hand, when the on/off changeover switch 92 is off, since the negative DC voltage output from the variable DC power supply 80 is not supplied to the pulse generator 84, the high frequency voltage output from the matching unit 34 is output, as it is, from the superimposing device 91.

That is, when the on/off changeover switch 92 is on, the superimposed voltage is applied to the upper electrodes 60 and 62, while when the on/off changeover switch 92 is off, the high frequency voltage is applied to the upper electrodes 60 and 62.

A ring-shaped ground part 96 made of, for example, a conductive member such as Ni or Al is provided to an appropriate portion in the chamber 10 facing the processing space PS (for example, the outer side in the radial direction of the outer upper electrode 62). The ground part 96 is provided to a ring-shaped insulator 98 made of, for example, ceramic, and is connected to the ceiling wall of the chamber 10 so as to be grounded via the chamber 10. When the superimposed voltage or the DC pulse voltage is applied from the voltage applying part 5 to the upper electrodes 60 and 62 during plasma processing, an electron current flows between the upper electrodes 60 and 62 and the ground part 96 via the plasma.

The individual operation of each configuration in the substrate processing apparatus 1 and the operation (sequence) of the entire substrate processing apparatus 1 are controlled by a controller (not shown). For example, the operations of the exhaust device 26, the high frequency power supply 30, the on/off changeover switches 44 and 92, the gas supply part 76, the chiller unit (not shown), the heat transfer gas supply part (not shown), etc. are controlled by the controller (not shown). An example of the controller may include a microcomputer.

<Substrate Processing with Substrate Processing Apparatus>

FIGS. 5 to 11 are views provided for explaining an example of substrate processing performed by the substrate processing apparatus according to the first embodiment. The substrate processing in the substrate processing apparatus 1 is performed according to the following steps 1-1 to 1-4.

Figure 5:
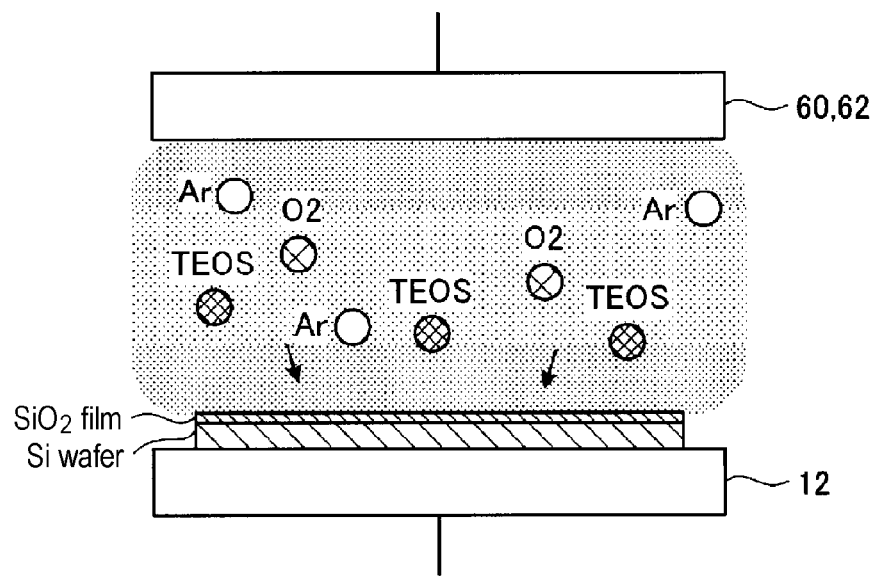
FIG. 5 is a view provided for explaining an example of substrate processing performed by the substrate processing apparatus according to the first embodiment.

<Step 1-1: FIG. 5>

FIG. 5 illustrates an example of the process of step 1-1. In the substrate processing apparatus 1, first, with the gate valve 28 opened, a semiconductor wafer W to be processed is transferred into the chamber 10 and is placed on the electrostatic chuck 40. Next, the on/off changeover switch 44 is turned on, and the semiconductor wafer W is attracted and held on the electrostatic chuck 40 by an electrostatic attraction force. Further, the internal pressure of the chamber 10 is adjusted to a set value (for example, 500 mTorr) by the exhaust device 26. Further, a heat transfer gas is supplied between the electrostatic chuck 40 and the semiconductor wafer W. As illustrated in FIG. 5, an example of the semiconductor wafer W may include a Si wafer.

Further, by turning off the on/off changeover switch 92, a high frequency voltage is applied to the upper electrodes 60 and 62 without applying a superimposed voltage. When the on/off changeover switch 92 is off, since the DC pulse voltage is not supplied to the superimposing device 91, the DC pulse voltage is also not applied to the upper electrodes 60 and 62. Further, since the substrate processing apparatus 1 adopts the configuration in FIG. 1, none of the high frequency voltage, the DC pulse voltage, and the superimposed voltage is applied to the susceptor 12.

Further, as process gases from the gas supply part 76, a TEOS gas, an $O_2$ gas, and an Ar gas are introduced into the chamber 10 at a predetermined flow rate. The Ar gas is used for stabilizing plasma.

Thus, the TEOS gas and the 02 gas discharged from the inner upper electrode 60 are turned into plasma in the processing space PS by discharge between the upper electrodes 60 and 62 and the susceptor 12 used as the lower electrode. Then, a $SiO_2$ film is formed on the surface of the Si wafer by radicals and ions contained in the plasma. The $SiO_2$ film is an example of an oxide film formed on the semiconductor wafer W.

Figure 6:
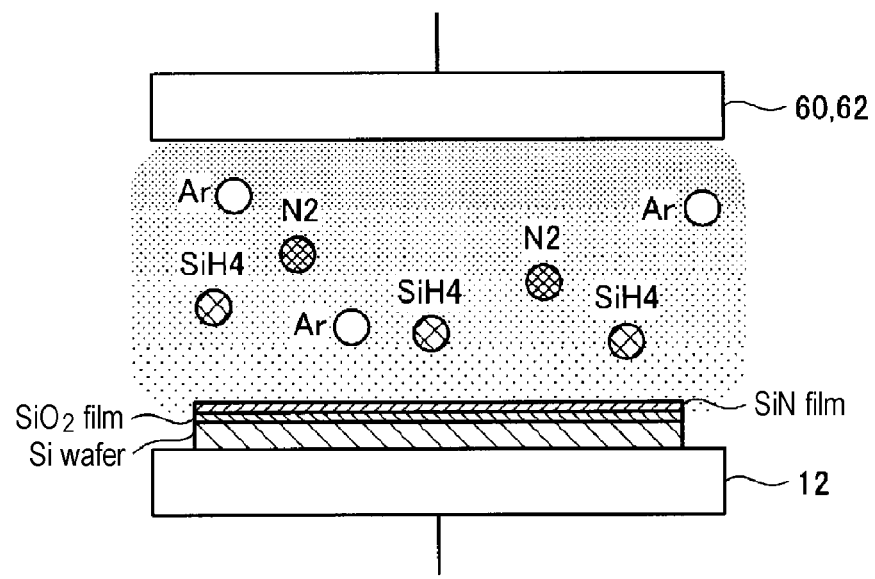
FIG. 6 is a view provided for explaining an example of substrate processing performed by the substrate processing apparatus according to the first embodiment.

<Step 1-2: FIG. 6>

FIG. 6 illustrates an example of the process of step 1-2. In step 1-2 following step 1-1, the on/off changeover switch 92 is turned on. By turning on the on/off changeover switch 92, a superimposed voltage is applied to the upper electrodes 60 and 62. Further, as process gases from the gas supply part 76, a $SiH_4$ gas, a Na gas, and an Ar gas are introduced into the chamber 10 at a predetermined flow rate. Thus, the $SiH_4$ gas and the Na gas discharged from the inner upper electrode 60 are turned into plasma in the processing space PS by discharge between the upper electrodes 60 and 62 and the susceptor 12 used as the lower electrode. Then, a SiN film is further formed (laminated) on the surface of the SiO$_2$ film formed in step 1-1, by radicals and ions contained in the plasma. The SiN film is an example of a nitride film formed on the semiconductor wafer W.

Figure 7:
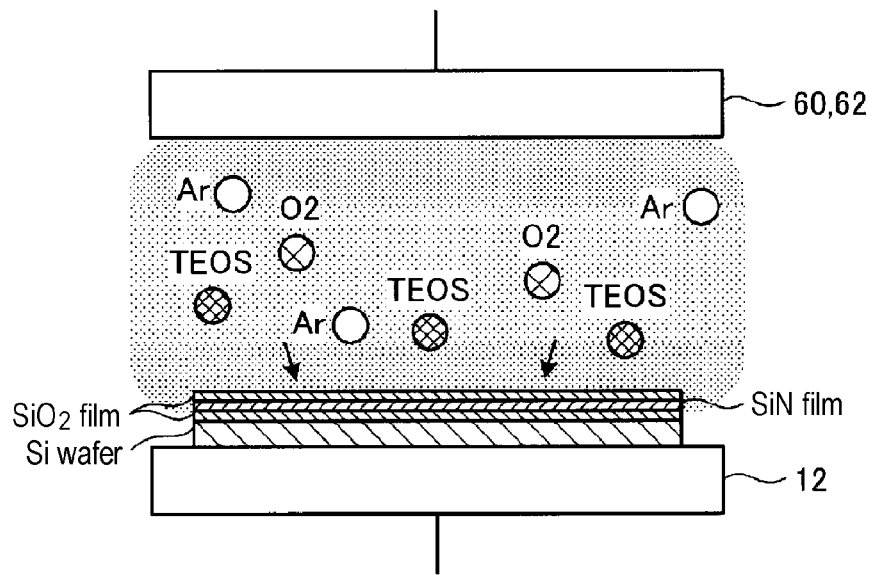
FIG. 7 is a view provided for explaining an example of substrate processing performed by the substrate processing apparatus according to the first embodiment.

<Step 1-3: FIG. 7>

FIG. 7 illustrates an example of the process of step 1-3. In step 1-3 following step 1-2, the on/off changeover switch 92 is turned off. By turning off the on/off changeover switch 92, a high frequency voltage is applied to the upper electrodes 60 and 62. Further, as process gases from the gas supply part 76, a TEOS gas, an O$_2$ gas, and an Ar gas are introduced into the chamber 10 at a predetermined flow rate. Thus, the TEOS gas and the O$_2$ gas discharged from the inner upper electrode 60 are turned into plasma in the processing space PS by discharge between the upper electrodes 60 and 62 and the susceptor 12 used as the lower electrode. Then, a SiO$_2$ film is further formed (laminated) on the surface of the SiN film formed in step 1-2 by radicals and ions contained in the plasma.

Figure 8:
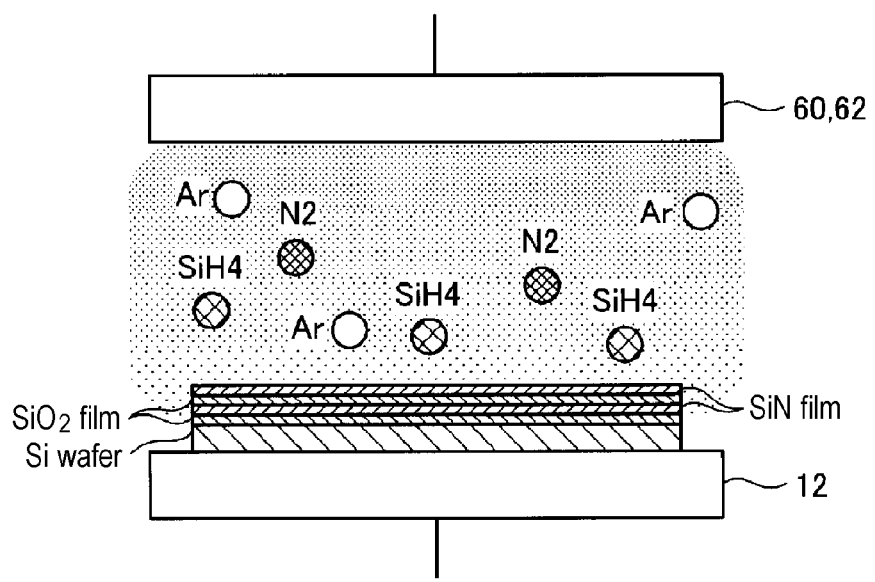
FIG. 8 is a view provided for explaining an example of substrate processing performed by the substrate processing apparatus according to the first embodiment.

<Step 1-4: FIG. 8>

FIG. 8 illustrates an example of the process of step 1-4. In step 1-4 following step 1-3, the on/off changeover switch 92 is turned on. By turning on the on/off changeover switch 92, a superimposed voltage is applied to the upper electrodes 60 and 62. Further, as process gases from the gas supply part 76, a SiH$_4$ gas, a N$_2$ gas, and an Ar gas are introduced into the chamber 10 at a predetermined flow rate. Thus, the SiH$_4$ gas and the N$_2$ gas discharged from the inner upper electrode 60 are turned into plasma in the processing space PS by discharge between the upper electrodes 60 and 62 and the susceptor 12 used as the lower electrode. Then, a SiN film is further formed (laminated) on the surface of the SiO$_2$ film formed in step 1-3, by radicals and ions contained in the plasma.

The processes of steps 1-1 to 1-4 have been described above.

Figure 9:
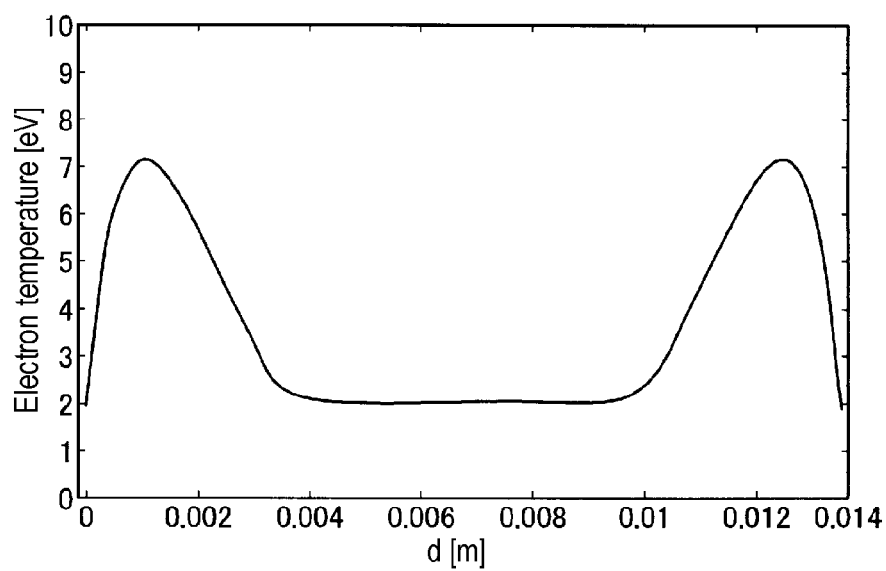
FIG. 9 is a view provided for explaining an example of substrate processing performed by the substrate processing apparatus according to the first embodiment.
Figure 10:
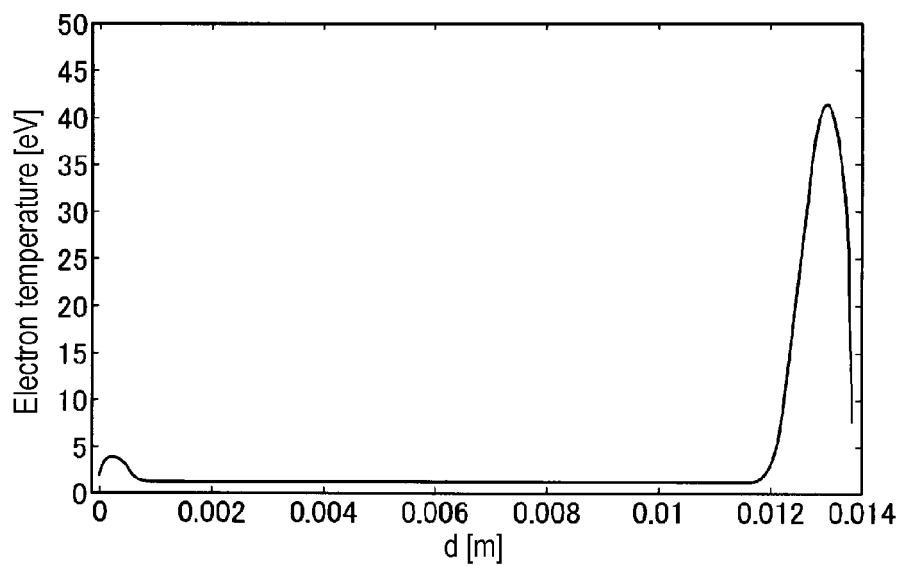
FIG. 10 is a view provided for explaining an example of substrate processing performed by the substrate processing apparatus according to the first embodiment.

FIG. 9 illustrates a distribution of electron temperature in the chamber 10 when the on/off changeover switch 92 is turned off and a high frequency voltage having a frequency of 40 MHz is applied to the upper electrodes 60 and 62 with the internal pressure of the chamber 10 set to 500 mTorr. Further, FIG. 10 illustrates a distribution of electron temperature in the chamber 10 when the on/off changeover switch 92 is turned on and a superimposed voltage is applied to the upper electrodes 60 and 62 with the internal pressure of the chamber 10 set to 500 mTorr. In FIG. 10, the superimposed voltage is generated by supplying a high frequency voltage having a frequency of 40 MHz and a DC pulse voltage having a duty ratio of 50% and a frequency of 500 kHz to the superimposing device 91. FIGS. 9 and 10 illustrate the relationship between a distance d in the z direction (FIG. 1) and the electron temperature (that is, the distribution of electron temperature in the chamber 10). The distance d indicates a distance from the upper surface of the susceptor 12 to the lower surface of the upper electrodes 60 and 62 with the upper surface of the susceptor 12 (that is, the upper surface of the electrostatic chuck 40) as a base point in the z direction (FIG. 1). FIGS. 9 and 10 show, as an example, a distribution of electron temperature when the distance d between the upper surface of the susceptor 12 and the lower surface of the upper electrodes 60 and 62 (that is, a gap between electrodes) is 0.014 m.

Figure 11:
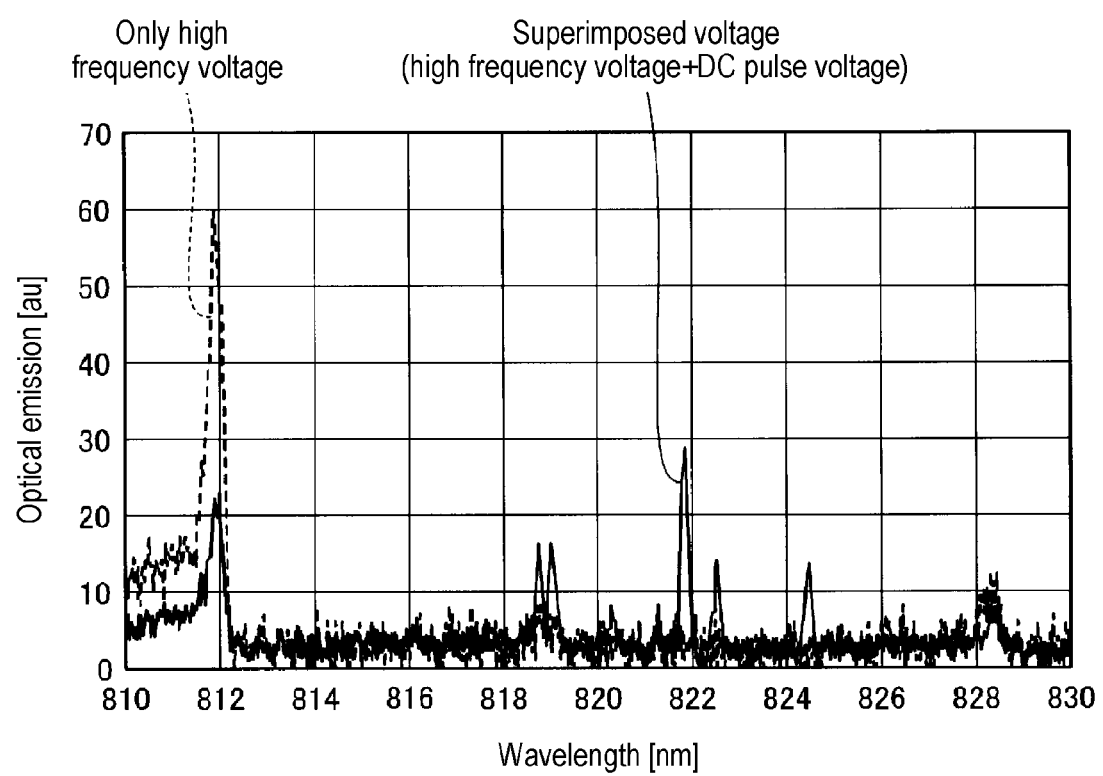
FIG. 11 is a view provided for explaining an example of substrate processing performed by the substrate processing apparatus according to the first embodiment.

Further, FIG. 11 illustrates the relationship between wavelength and emission intensity when only a high frequency voltage or a superimposed voltage is applied to the upper electrodes 60 and 62 with the internal pressure of the chamber 10 set to 500 mTorr.

That is, a state when the processes of steps 1-1 and 1-3 (FIGS. 5 and 7) are performed is shown in FIG. 9, and a state when the processes of steps 1-2 and 1-4 (FIGS. 6 and 8) are performed is shown in FIGS. 10 and 11.

When the processes of steps 1-1 and 1-3 are performed, that is, when the high frequency voltage is applied to the upper electrodes 60 and 62, as illustrated in FIG. 9, the electron temperature rises both in the vicinity of the upper surface of the susceptor 12 and in the vicinity of the lower surface of the upper electrodes 60 and 62. The higher the electron temperature, the more the dissociation of a process gas is promoted to increase the amount of generation of plasma, so that radicals contained in the plasma increase. Further, the higher the electron temperature, the more the ions contained in the plasma is activated, so that the effect of improving the film quality is increased and the film density is increased.

Therefore, by the processes of steps 1-1 and 1-3, the radicals that are the source of forming the SiO$_2$ film are increased in the vicinity of the lower surface of the upper electrodes 60 and 62, while the activity of the ions contained in the plasma are increased near the upper surface of the susceptor 12. Therefore, the SiO$_2$ film having a high film density can be efficiently formed by the processes of steps 1-1 and 1-3.

In contrast, when the processes of steps 1-2 and 1-4 are performed, that is, when the superimposed voltage is applied to the upper electrodes 60 and 62, as illustrated in FIG. 10, in comparison with FIG. 9, while the electron temperature in the vicinity of the lower surface of the upper electrodes 60 and 62 further rises, the electron temperature in the vicinity of the upper surface of the susceptor 12 drops significantly. As illustrated in FIG. 11, the rise in the electron temperature in the vicinity of the lower surface of the upper electrodes 60 and 62 promotes the dissociation of N$_2$ immediately below the upper electrodes 60 and 62 to increase the N radicals that are the source of forming the SiN film. It can be seen from FIG. 11 that when the superimposed voltage is applied to the upper electrodes 60 and 62, the emission intensity of N$_2$ is reduced as compared with the case where only the high frequency voltage is applied, while the dissociation of N$_2$ is promoted to increase the emission intensity of N radicals (that is, the N radicals are increased). Therefore, by applying the superimposed voltage to the upper electrodes 60 and 62, the nitriding power in the SiN film formed by the processes in steps 1-2 and 1-4 can be strengthened.

On the other hand, the lower the electron temperature, the smaller the degree of damage to an electrode due to ions.

Therefore, by the processes of steps 1-2 and 1-4, it is possible to form a SiN film having enhanced nitriding power while suppressing damage to the susceptor 12.

As described above, in the first embodiment, in the process of steps 1-1 and 1-3, the SiO$_2$ film is formed on the Si wafer by applying the high frequency voltage to the upper electrodes 60 and 62 without applying the DC pulse voltage to the upper electrodes 60 and 62 and the susceptor 12 to perform a process on the Si wafer. Further, in the first embodiment, in the processes of steps 1-2 and 1-4, the SiN film is formed on the Si wafer by applying the superimposed voltage to the upper electrodes 60 and 62 to perform a process on the Si wafer. The Si wafer is an example of a semiconductor wafer W as a target substrate. The SiO$_2$ film is an example of an oxide film, and the SiN film is an example of a nitride film.

By doing so, in the processes of steps 1-1 and 1-3, it is possible to form the SiO$_2$ film efficiently while improving the film quality. On the other hand, in the processes of steps 1-2 and 1-4, it is possible to form the SiN film having enhanced nitriding power while suppressing damage to the susceptor 12. In this way, according to the first embodiment, two different film forming processes on the Si wafer can be performed in one chamber 10.

Further, in the first embodiment, the substrate processing apparatus 1 has the impedance adjustment circuit 100 connected between the susceptor 12 and the ground.

By doing so, it is possible to reduce the impedance between the upper electrodes 60 and 62 and the susceptor 12, so that the high frequency voltage applied to the upper electrodes 60 and 62 and the high frequency voltage component of the superimposed voltage applied to the upper electrodes 60 and 62 easily reach the susceptor 12.

Second Embodiment

<Configuration of Substrate Processing Apparatus>

Figure 12:
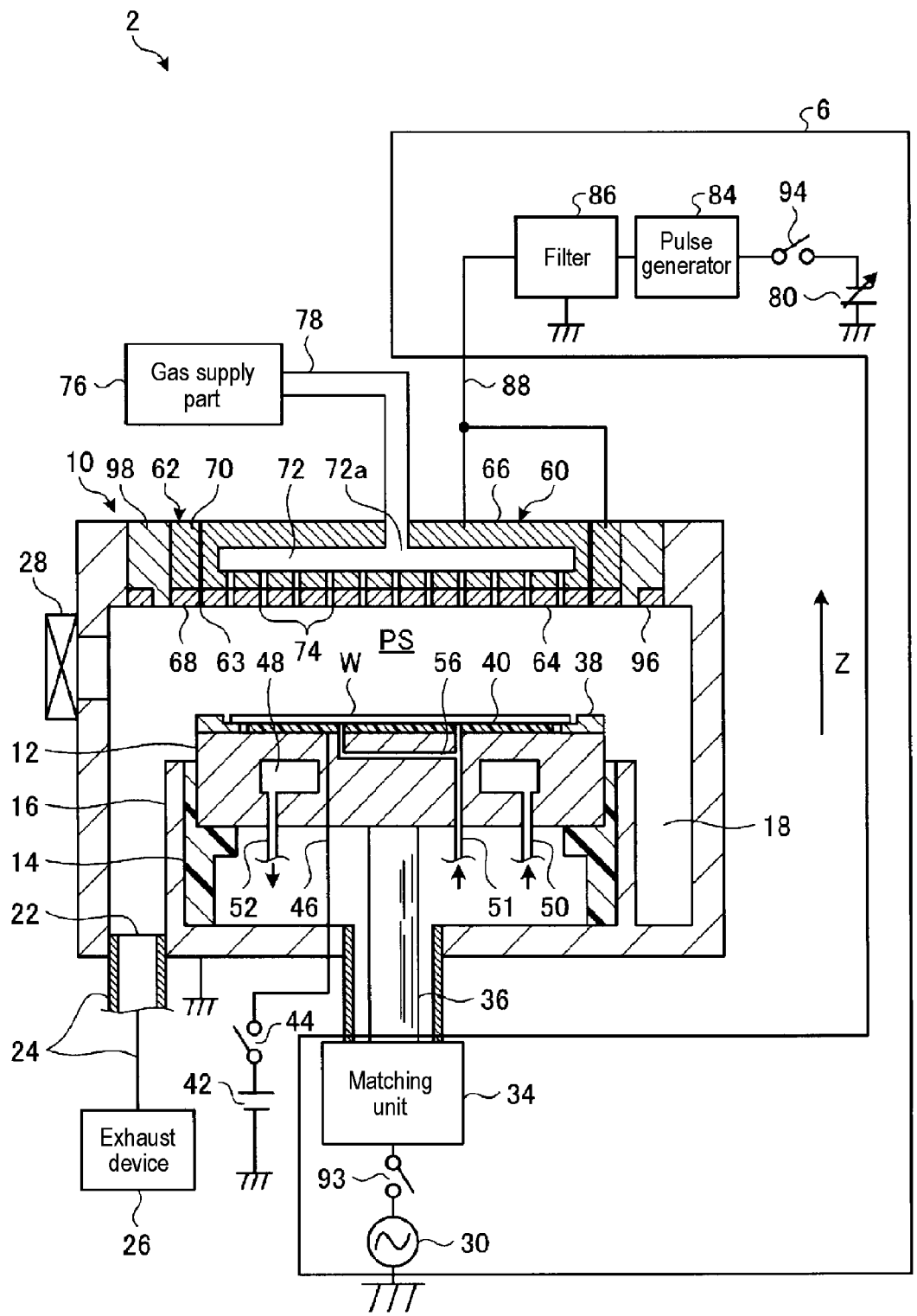
FIG. 12 is a view illustrating showing a configuration example of a substrate processing apparatus according to a second embodiment.

FIG. 12 is a view illustrating a configuration example of a substrate processing apparatus according to a second embodiment. The substrate processing apparatus 2 illustrated in FIG. 12 is configured as a capacitively-coupled parallel flat plate substrate processing apparatus, similarly to the substrate processing apparatus 1 (FIG. 1) according to the first embodiment. Hereinafter, the substrate processing apparatus 2 illustrated in FIG. 12 will be described with a configuration different from that of the substrate processing apparatus 1 (FIG. 1) according to the first embodiment.

The substrate processing apparatus 2 has a voltage applying part 6. The voltage applying part 6 includes a high frequency power supply 30, an on/off changeover switch 93, a matching unit 34, a variable DC power supply 80, an on/off changeover switch 94, a pulse generator 84, and a filter 86.

The high frequency power supply 30 is electrically connected to the susceptor 12 via the on/off changeover switch 93, the matching unit 34, and a connecting rod 36. The high frequency power supply 30 of the present embodiment mainly contributes to the attraction of ions to a semiconductor wafer W placed on the susceptor 12. The matching unit 34 matches the impedance on the high frequency power supply 30 side with the impedance on a load (mainly electrodes, plasma, chamber etc.) side. A high frequency voltage generated by the high frequency power supply 30 is supplied to the susceptor 12 via the on/off changeover switch 93. Therefore, when the on/off changeover switch 93 is on, the high frequency voltage is applied to the susceptor 12, while when the on/off changeover switch 93 is off, the high frequency voltage is not applied to the susceptor 12.

On the other hand, a negative DC voltage output from the variable DC power supply 80 is supplied to the pulse generator 84 via the on/off changeover switch 94. Therefore, when the on/off changeover switch 94 is on, a DC pulse voltage is applied to the upper electrodes 60 and 62, while when the on/off changeover switch 94 is off, the DC pulse voltage is not applied to the upper electrodes 60 and 62.

The individual operation of each configuration in the substrate processing apparatus 2 and the operation (sequence) of the entire substrate processing apparatus 2 are controlled by a controller (not shown). For example, the operations of the exhaust device 26, the high frequency power supply 30, the on/off changeover switches 44, 93, and 94, the gas supply part 76, the chiller unit (not shown), the heat transfer gas supply part (not shown), etc. are controlled by the controller (not shown). An example of the controller may include a microcomputer.

<Substrate Processing with Substrate Processing Apparatus>

FIGS. 13 to 16 are views provided for explaining an example of substrate processing performed by the substrate processing apparatus according to the second embodiment. The substrate processing in the substrate processing apparatus 2 is performed according to the following steps 2-1 to 2-3.

Figure 13:
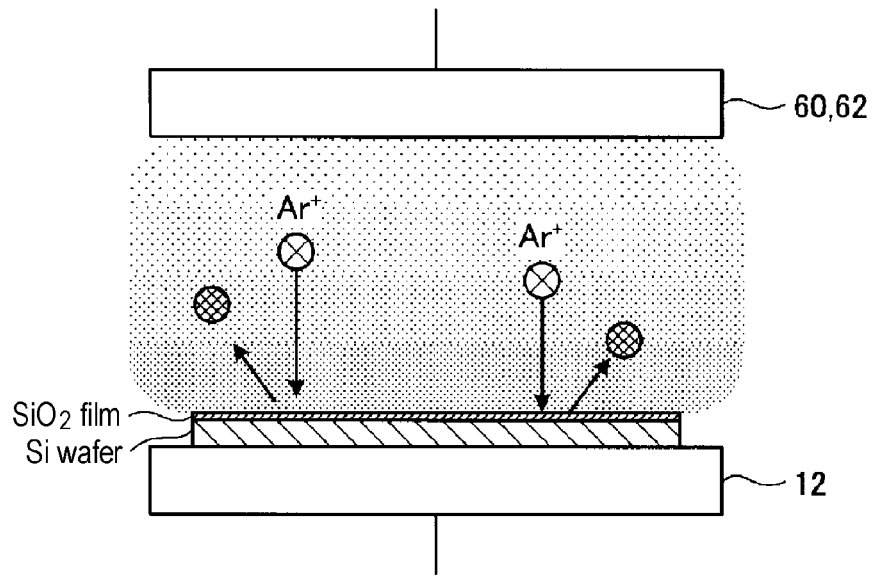
FIG. 13 is a view provided for explaining an example of substrate processing performed by the substrate processing apparatus according to the second embodiment.

<Step 2-1: FIG. 13>

FIG. 13 illustrates an example of the process of step 2-1. In the substrate processing apparatus 2, first, with the gate valve 28 opened, a semiconductor wafer W to be processed is transferred into the chamber 10 and is placed on the electrostatic chuck 40. Next, the on/off changeover switch 44 is turned on, and the semiconductor wafer W is attracted and held on the electrostatic chuck 40 by an electrostatic attraction force. Further, the internal pressure of the chamber 10 is adjusted to a set value (for example, 500 mTorr) by the exhaust device 26. Further, a heat transfer gas is supplied between the electrostatic chuck 40 and the semiconductor wafer W. As illustrated in FIG. 13, an example of the semiconductor wafer W may include a Si wafer. A natural oxide film that becomes an electrical resistance adheres to the surface of this Si wafer. An example of the natural oxide film adhering to the surface of the Si wafer may include a SiO$_2$ film.

Further, by turning off the on/off changeover switch 94 while turning on the on/off changeover switch 93, a high frequency voltage is applied to the susceptor 12 without applying a DC pulse voltage to the upper electrodes 60 and 62. Further, since the substrate processing apparatus 2 adopts the configuration shown in FIG. 12, a high frequency voltage is not applied to the upper electrodes 60 and 62, and a DC pulse voltage is not applied to the susceptor 12.

Further, as a process gas from the gas supply part 76, an Ar gas is introduced into the chamber 10 at a predetermined flow rate.

Thus, the Ar gas discharged from the inner upper electrode 60 is turned into plasma in the processing space PS by discharge between the upper electrodes 60 and 62 and the susceptor 12 used as the lower electrode. Then, ion bombardment is performed on the Si wafer by Ar ions contained in the plasma, so that the SiO$_2$ film adhering to the surface of the Si wafer is washed out.

Figure 14:
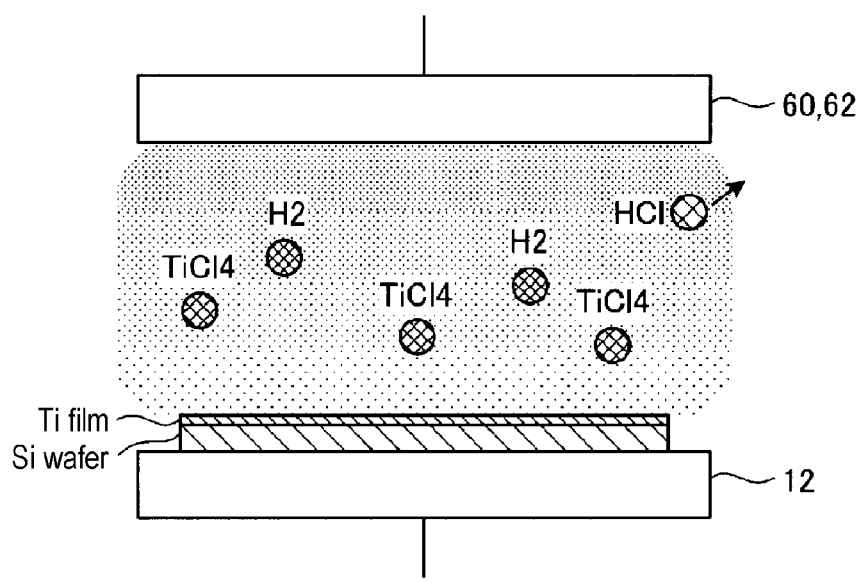
FIG. 14 is a view provided for explaining an example of substrate processing performed by the substrate processing apparatus according to the second embodiment.

<Step 2-2: FIG. 14>

FIG. 14 illustrates an example of the process of step 2-2. In step 2-2 following step 2-1, the on/off changeover switch 93 is turned off, while the on/off changeover switch 94 is turned on. Thus, a DC pulse voltage is applied to the upper electrodes 60 and 62 without applying a high frequency voltage to the susceptor 12. Further, as process gases from the gas supply part 76, a TiCl$_4$ gas and a H$_2$ gas are introduced into the chamber 10 at a predetermined flow rate. Thus, the TiCl$_4$ gas and the H$_2$ gas discharged from the inner upper electrode 60 are turned into plasma in the processing space PS by discharge between the upper electrodes 60 and 62 and the susceptor 12 used as the lower electrode, and a Ti film is formed on the surface of the Si wafer by radicals and ions contained in the plasma. Further, HCl is generated by binding Cl of TiCl$_4$ and H$_2$.

Figure 15:
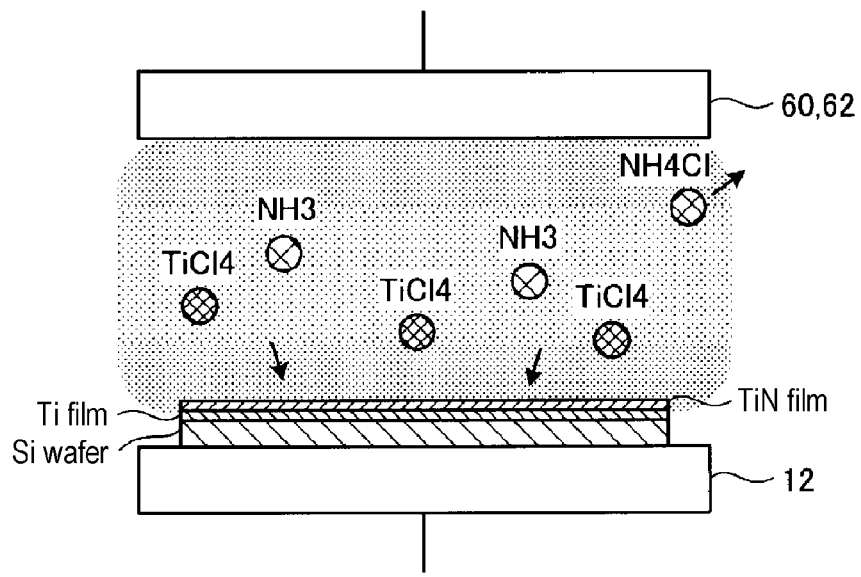
FIG. 15 is a view provided for explaining an example of substrate processing performed by the substrate processing apparatus according to the second embodiment.

<Step 2-3: FIG. 15>

FIG. 15 illustrates an example of the process of step 2-3. In step 2-3 following step 2-2, both the on/off changeover switch 93 and the on/off changeover switch 94 are turned on. Thus, a high frequency voltage is applied to the susceptor 12, while a DC pulse voltage is applied to the upper electrodes 60 and 62. Further, as process gases from the gas supply part 76, a TiCl$_4$ gas and an NH$_3$ gas are introduced into the chamber 10 at a predetermined flow rate. Thus, the TiCl$_4$ gas and the NH$_3$ gas discharged from the inner upper electrode 60 are turned into plasma in the processing space PS by discharge between the upper electrodes 60 and 62 and the susceptor 12 used as the lower electrode, and a TiN film is further formed (laminated) on the surface of the Ti film formed in step 2-2, by radicals and ions contained in this plasma.

The processes of steps 2-1 to 2-3 have been described above.

Figure 16:
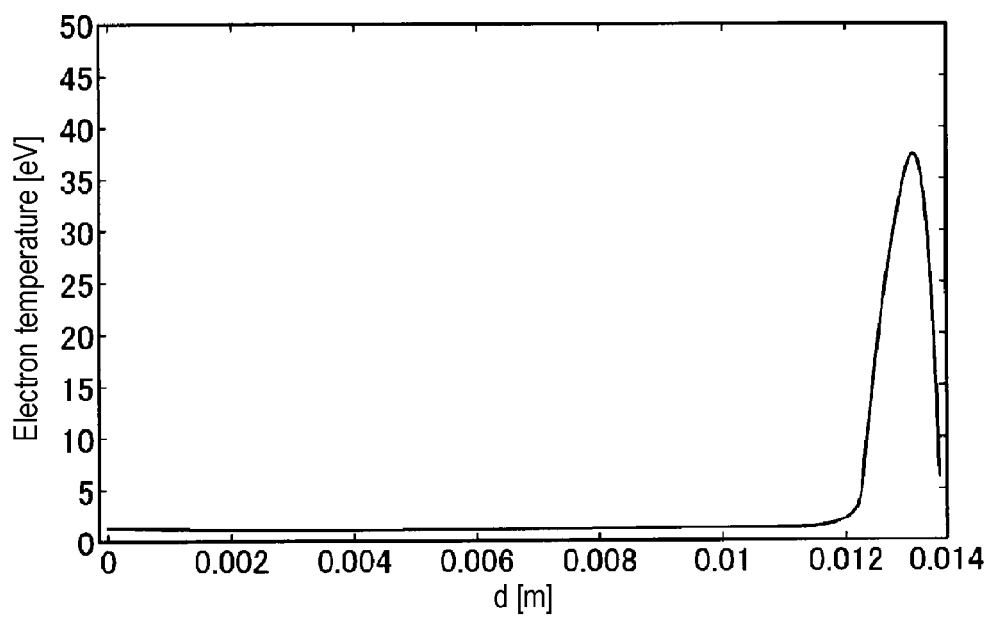
FIG. 16 is a view provided for explaining an example of substrate processing performed by the substrate processing apparatus according to the second embodiment.

A distribution of electron temperature in the chamber 10 when the on/off changeover switch 94 is turned off while the on/off changeover switch 93 is turned on and a high frequency voltage having a frequency of 40 MHz is applied to the susceptor 12 with the internal pressure of the chamber 10 set to 500 mTorr is similar to that illustrated in FIG. 9. Further, FIG. 16 illustrates a distribution of electron temperature in the chamber 10 when the on/off changeover switch 94 is turned on while the on/off changeover switch 93 is turned off and a DC pulse voltage having a duty ratio of 50% and a frequency of 500 kHz is applied to the upper electrodes 60 and 62 with the internal pressure of the chamber 10 set to 500 mTorr. Further, a distribution of electron temperature in the chamber 10 when both the on/off changeover switches 93 and 94 are turned on, a high frequency voltage having a frequency of 40 MHz is applied to the susceptor 12, and a DC pulse voltage having a duty ratio of 50% and a frequency of 500 kHz is applied to the upper electrodes 60 and 62 with the internal pressure of the chamber 10 set to 500 mTorr is similar to that illustrated in FIG. 10. As in FIGS. 9 and 10, as an example, a distribution of electron temperature when a distance d between the upper surface of the susceptor 12 and the lower surface of the upper electrodes 60 and 62 (that is, a gap between electrodes) is 0.014 m is illustrated in FIG. 16.

Further, the relationship between wavelength and emission intensity when a high frequency voltage is applied to the susceptor 12 and a DC pulse voltage is applied to the upper electrodes 60 and 62 with the internal pressure of the chamber 10 set to 500 mTorr is similar to that illustrated in FIG. 11.

That is, a state when the process of step 2-1 (FIG. 13) is performed is shown in FIG. 9, a state when the process of step 2-2 (FIG. 14) is performed is shown in FIG. 16, and a state when the process of step 2-3 (FIG. 15) is performed is shown in FIGS. 10 and 11.

When the process of step 2-1 is performed, that is, when a high frequency voltage is applied to the susceptor 12, as illustrated in FIG. 9, the electron temperature rises both in the vicinity of the upper surface of the susceptor 12 and in the vicinity of the lower surface of the upper electrodes 60 and 62. The higher the electron temperature, the more the dissociation of a process gas is promoted to increase the amount of generation of plasma, so that ions contained in the plasma increase. Further, the higher the electron temperature, the more the ions contained in the plasma is activated. Therefore, by the process of step 2-1, Ar ions used for ion bombardment are increased in the vicinity of the lower surface of the upper electrodes 60 and 62, while the activity of Ar ions contained in the plasma is increased in the vicinity of the upper surface of the susceptor 12. Therefore, the washing effect of the ion bombardment by the Ar ions can be improved by the process of step 2-1.

Further, when the process of step 2-2 is performed, that is, when a DC pulse voltage is applied to the upper electrodes 60 and 62, as illustrated in FIG. 16, in comparison with FIG. 9, while the electron temperature in the vicinity of the lower surface of the upper electrodes 60 and 62 further rises, the electron temperature in the vicinity of the upper surface of the susceptor 12 drops significantly. The higher the electron temperature, the more the dissociation of the process gas is promoted to increase the amount of generation of plasma, so that radicals contained in the plasma increase. Further, the lower the electron temperature, the smaller the degree of damage to an electrode due to ions.

Therefore, by the process of step 2-2, the Ti film can be efficiently formed by the radicals generated in large quantities directly under the upper electrodes 60 and 62 while suppressing damage to the susceptor 12.

Further, when the process of step 2-3 is performed, that is, when a high frequency voltage is applied to the susceptor 12 and a DC pulse voltage is applied to the upper electrodes 60 and 62, as illustrated in FIG. 10, in comparison with FIG. 16, the electron temperature in the vicinity of the upper surface of the susceptor 12 rises slightly while the electron temperature in the vicinity of the lower surface of the upper electrodes 60 and 62 is maintained at a high temperature similar to that in FIG. 16. Since the electron temperature in the vicinity of the lower surface of the upper electrodes 60 and 62 is maintained at a high temperature, as illustrated in FIG. 11, the dissociation of NH$_3$ immediately below the upper electrodes 60 and 62 is promoted to increase N radicals which are the source of forming the TiN film. It can be seen from FIG. 11 that when the high frequency voltage is applied to the susceptor 12 and the DC pulse voltage is applied to the upper electrodes 60 and 62, the emission intensity of N$_2$ is decreased while the dissociation of N$_2$ is promoted to increase the emission intensity of N radicals (that is, the N radicals are increased), as compared with when only the high frequency voltage is applied to the susceptor 12. Therefore, by applying the DC pulse voltage to the upper electrodes 60 and 62 while the high frequency voltage is applied to the susceptor 12, the nitriding power in the TiN film formed in the process of steps 2-3 can be strengthened.

Further, in FIG. 10, since the electron temperature in the vicinity of the upper surface of the susceptor 12 rises slightly in comparison with FIG. 16, in the process of step 2-3, the ion activity increases in the vicinity of the upper surface the susceptor 12 as compared with the process of step 2-2.

Therefore, by the process of steps 2-3, the TiN film having strengthened nitriding power and high film density can be efficiently formed.

As described above, in the second embodiment, in the ion bombardment process of step 2-1, by performing a process on the Si wafer by applying the high frequency voltage to the susceptor 12 without applying the DC pulse voltage to the upper electrodes 60 and 62 and the susceptor 12, the SiO$_2$ film adhering to the surface of the Si wafer is washed. The Si wafer is an example of the semiconductor wafer W as a target substrate, and the SiO$_2$ film is an example of the natural oxide film. Further, in the second embodiment, in the film forming process of step 2-2, by performing a process on the Si wafer by applying the DC pulse voltage to the upper electrodes 60 and 62 without applying the high frequency voltage to the upper electrodes 60 and 62 and the susceptor 12, the Ti film is formed on the Si wafer.

By doing so, the washing effect of the ion bombardment can be improved in the process of step 2-1. On the other hand, in the process of step 2-2, the Ti film can be efficiently formed while suppressing damage to the susceptor 12. In this way, according to the second embodiment, two different processes for the Si wafer, that is, the ion bombardment process and the film forming process, can be performed in one chamber 10.

The first and second embodiments have been described above.

As described above, in the first and second embodiments, the substrate processing apparatuses 1 and 2 have the chamber 10 capable of being vacuum-exhausted, the susceptor 12 used as the lower electrode, and the upper electrodes 60 and 62. The semiconductor wafer W can be placed on the susceptor 12. The upper electrodes 60 and 62 are disposed in the chamber 10 so as to face the susceptor 12. Then, in the substrate processing apparatuses 1 and 2, a first process on the semiconductor wafer W is performed using a high frequency voltage without using a DC pulse voltage, while a second process on the semiconductor wafer W is performed using the DC pulse voltage. An example of the first process may include the process of step 1-1 or the process of step 2-1. An example of the second process may include the process of step 1-2 or the process of step 2-2.

By doing so, two different processes for the semiconductor wafer W, that is, the first process and the second process, can be performed in one chamber 10, so that the manufacturing cost of semiconductor devices can be suppressed.

It should be noted that the embodiments of the present disclosure are exemplary in all respects and not restrictive. Indeed, the above embodiments can be embodied in a variety of forms. Further, the above embodiments may be omitted, replaced or changed in various forms without departing from the claims and the gist thereof.

EXPLANATION OF REFERENCE NUMERALS 1, 2: substrate processing apparatus, 5, 6: voltage applying part, 10: chamber, 12: susceptor, 60: inner upper electrode, 62: outer upper electrode

What is claimed is:

1. A substrate processing method in a substrate processing apparatus including a processing container capable of being vacuum-exhausted, a lower electrode on which a target substrate can be placed in the processing container, and an upper electrode disposed in the processing container so as to face the lower electrode, the method comprising:
   performing a first process on the target substrate using an AC voltage without using a DC pulse voltage, wherein the first process is performed by applying the AC voltage to the upper electrode without applying the DC pulse voltage to the upper electrode and the lower electrode; and
   performing a second process on the target substrate using the DC pulse voltage, wherein the second process is performed by applying the AC voltage to the upper electrode whose reference potential changes alternately up and down with a passage of time due to the DC pulse voltage,
   wherein an oxide film is formed by the first process, and
   wherein a nitride film is formed by the second process.

2. The substrate processing method of claim 1, wherein the substrate processing apparatus further includes an impedance adjustment circuit connected between the lower electrode and a ground.

* * * * *